United States Patent
Kemmoku (10) Patent No.: US 7,233,836 B2
(45) Date of Patent: Jun. 19, 2007

(54) EXPOSURE APPARATUS AND DEVICE MANUFACTURING METHOD

(75) Inventor: Hiromi Kemmoku, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 245 days.

(21) Appl. No.: 10/969,072

(22) Filed: Oct. 21, 2004

(65) Prior Publication Data

US 2005/0102263 A1    May 12, 2005

(30) Foreign Application Priority Data

Oct. 24, 2003 (JP) .............................. 2003-364955

(51) Int. Cl.
*G06F 19/00* (2006.01)
(52) U.S. Cl. ...................................... 700/121; 355/53
(58) Field of Classification Search ................ 700/121; 355/53, 77, 52; 430/30
See application file for complete search history.

(56) References Cited

U.S. PATENT DOCUMENTS

| | | | |
|---|---|---|---|
| 5,424,552 A | 6/1995 | Tsuji et al. .................. | 250/548 |
| 6,320,646 B1 * | 11/2001 | Mouri ........................... | 355/53 |
| 6,338,925 B1 * | 1/2002 | Tomimatu ..................... | 430/30 |

FOREIGN PATENT DOCUMENTS

| | | |
|---|---|---|
| JP | 5-21319 | 1/1993 |
| JP | 9-270382 | 10/1997 |
| JP | 2003-31462 | 1/2003 |
| JP | 2003-031462 | * 1/2003 |
| WO | WO 00/72365 | * 11/2000 |
| WO | WO 00/72365 A1 | 11/2000 |

OTHER PUBLICATIONS

Japanese Office Action dated Oct. 24, 2005, issued in corresponding Japanese patent application No. 2003-364955, with English translation.

* cited by examiner

*Primary Examiner*—Leo Picard
*Assistant Examiner*—Steven R. Garland
(74) *Attorney, Agent, or Firm*—Fitzpatrick, Cella, Harper & Scinto (57) ABSTRACT

An exposure apparatus for exposing a subject to a pattern. The apparatus includes an update system to update a parameter necessary for processing in the exposure apparatus through measurement, a setting system to set a validity period of the parameter updated by the update system, and a control system to cause the update system to perform an update based on the validity period. Prior to execution of a unit of the processing, the control system determines whether the update by the update system is to be performed, based on a predicted completion time of the unit and the validity period.

11 Claims, 13 Drawing Sheets

RELATION BETWEEN VALIDITY PERIOD
AND PREDICTED CORRECTION VALUE

FIG. 8B

MEASURED VALUE IS LESS THAN PREDICTED VALUE

FIG. 8C

MEASURED VALUE IS GREATER THAN PREDICTED VALUE

EXPOSURE APPARATUS AND DEVICE MANUFACTURING METHOD

FIELD OF THE INVENTION

The present invention relates to an exposure technique for manufacturing micro devices, including a semiconductor device, such as an IC or an LSI, a liquid crystal substrate, a CCD, and a thin film magnetic head.

BACKGROUND OF THE INVENTION

Conventionally, in a process of fabricating a semiconductor with an ultra fine pattern, such as an LSI or a VLSI, a reduced projection exposure apparatus (hereinbelow, simply referred to as an "exposure apparatus"), which reduction-exposes a substrate coated with a photosensitive material to a circuit pattern drawn on a mask, thereby print-forming the pattern, is employed. In accordance with an increase in packaging density, further microminiaturization of a pattern is required, and handling such a pattern is required in the exposure apparatus.

To form an ultra fine pattern with the exposure apparatus, it is necessary to maintain high processing accuracy, such as focus accuracy, to bring an image formation surface (focus surface) of a reduced projection lens into correspondence with a subject (wafer) surface and an alignment accuracy for alignment of respective patterns through plural process steps. For this purpose, in the exposure apparatus, adjustable correction parameters are measured and set prior to substrate (wafer) exposure processing, and apparatus running is performed while the organized constituent elements (units) are controlled based on the parameters.

However, even when the correction parameters have been previously adjusted based on measurement, proper values (true values) of the correction parameters vary with an elapse of time, due to vibration during apparatus running, environmental change in atmospheric pressure, temperature, and the like, and thermal factors, such as exposure heat, and the like. That is, the correction parameters move away from the proper values. Accordingly, it is necessary to appropriately correct the correction parameter values by the amounts of fluctuation in the respective constituent elements.

Figure 5:
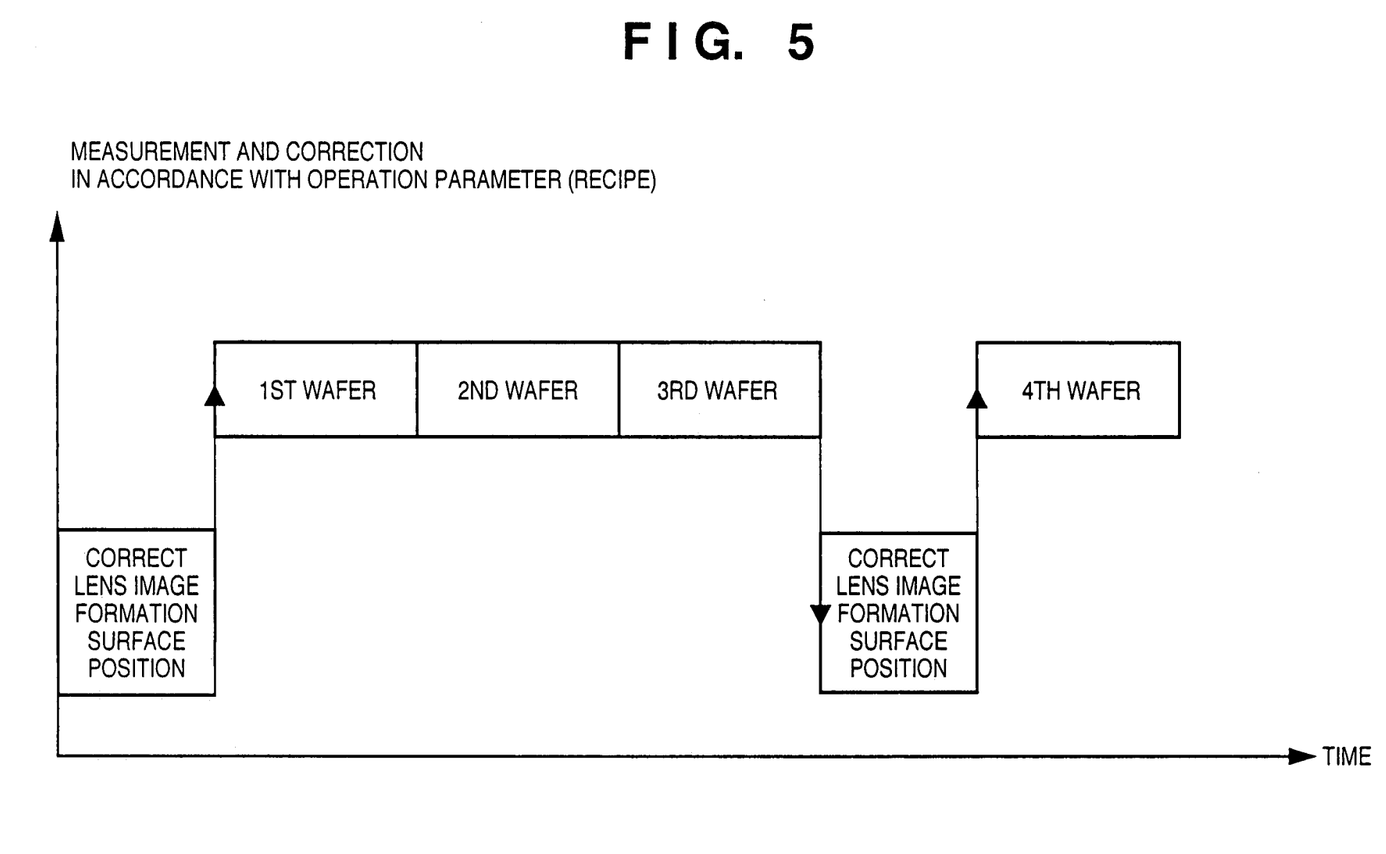
FIG. 5 is a timing chart showing the conventional apparatus correction operation.

Next, a conventional correction method for running control will be described. Prior to exposure of a substrate (wafer) by an exposure apparatus, an operator sets a recipe (operation parameters) for the exposure apparatus in accordance with a semiconductor device circuit pattern. The exposure apparatus sequentially performs exposure processing on the substrates (wafers), while controlling the constituents (units) in accordance with the recipe. FIG. 5 shows an example of a time chart of substrate (wafer) exposure by the exposure apparatus. In the figure, the lateral axis represents time, and a rectangular block, a brief segment of processing. In this example, while a substrate (wafer) is repeatedly exposed, the amount of fluctuation of an image formation surface position of a projection lens from a designed value (correction parameter) due to exposure heat of illumination on the reduced projection lens, or the like, is measured, and the image formation surface position is corrected by a predetermined number of wafers (three in FIG. 5).

When production by the exposure apparatus is started based on the recipe to measure the fluctuation of the image formation surface position of the projection lens (correction parameter) and corrects the position by three substrates (wafers), the fluctuation of the image formation surface position of the projection lens is measured prior to exposure of a first substrate (wafer), and the fluctuation-adjustable constituent elements (units) are properly controlled in accordance with the correction value. Next, substrate (wafer) exposure processing is repeated for three wafers, and again, the fluctuation of the image formation surface position of the projection lens is measured and correction is performed. Hereinafter, the measurement and correction are repeated by processing for three wafers. Thereby, the processing accuracy of the apparatus is maintained (for example, see Japanese Patent No. 3218631, paragraph 0063, which matured from Japanese Patent Laid-Open No. 5-021319).

In accordance with the development of recent ultra micro devices, the exposure apparatus must maintain higher accuracy. Today, several hundreds of correction parameters are known, and further, the number of correction parameters is increased for maintaining the apparatus accuracy. Further, allowable fluctuation amounts of the respective correction values are increasingly severe.

In this situation, in a case wherein the correction timing of the correction parameter is set with a predetermined number of wafers, as in the above-described conventional art, the difference between the correction parameter and a proper value might exceed a threshold value during wafer processing. In such a case, the quality of exposure in the wafer cannot be ensured, and the yield is degraded.

Further, the increase in the number of correction parameters increases the time required for measurement and correction of the parameters. As the fluctuation amounts become stricter, the measurement and correction phase must be repeated in a short period, and thus, the productivity of the exposure apparatus is degraded. Accordingly, it is important to prevent degradation of productivity of the exposure apparatus while maintaining accuracy of correction parameters. Further, to previously determine a correction period (correction timing) for each of the correction parameters by an operator, as in the above-described conventional art, requires a lot of time and effort.

SUMMARY OF THE INVENTION

The present invention has been made in consideration of the above problems, and has its object to suppress unnecessary degradation of productivity in exposure processing while retaining necessary exposure accuracy.

According to one aspect of the present invention, there is provided an exposure apparatus for exposing a subject to a pattern, comprising an update system to update a parameter necessary for processing in the exposure apparatus through measurement, a setting system to set a validity period of the parameter updated by the update system, and a control system to cause the update system to perform an update based on the validity period.

Further, in a device fabrication method according to the present invention, a device is fabricated by using the above-described exposure apparatus.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
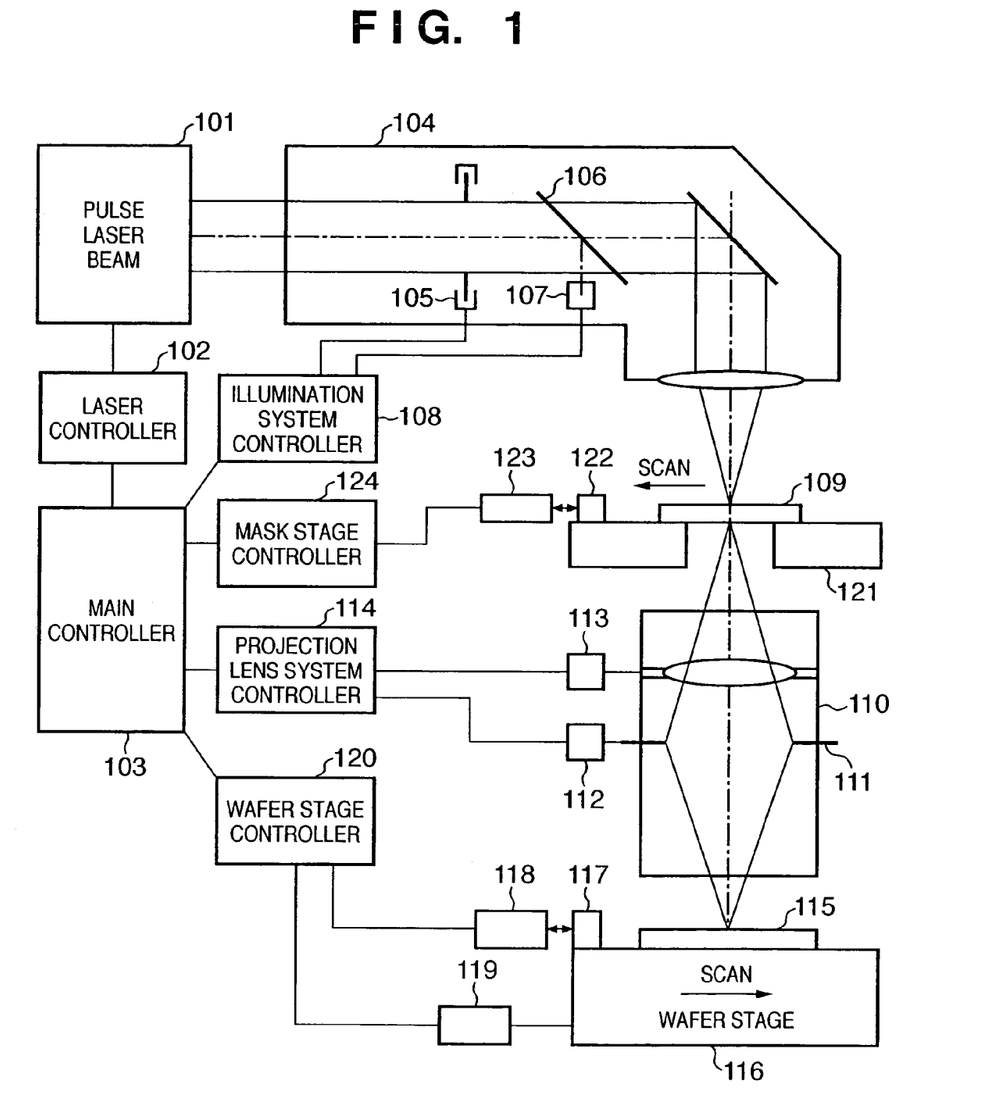
FIG. 1 is a block diagram schematically showing the construction of an exposure apparatus according to a first embodiment of the present invention.

FIG. 1 is a block diagram schematically showing the construction of a step-and-scan type exposure apparatus according to a first embodiment of the present invention. In FIG. 1, reference numeral 101 denotes a pulse laser light source, filled with gas, such as KrF, to emit laser light. The pulse laser light source 101 emits light with a wavelength of 248 nm in a far ultraviolet area. Further, the pulse laser light source 101 is provided with a front mirror as a resonance unit, a diffraction grating to narrow the band of the exposure wavelength, a narrow-band module including a prism, a monitor module including a spectroscope, a detector, and the like, for monitoring stability of the wavelength and spectral bandwidth, a shutter, and the like (all not shown). A laser controller 102 performs control for a gas exchange operation in the pulse laser light source 101 and control for wavelength stabilization, control of discharged/applied voltage, and the like. In the first embodiment, the laser controller 102 does not perform controls only by itself, but the controls are performed in accordance with commands from a main controller 103, which controls the overall exposure apparatus connected with an interface cable.

A beam emitted from the pulse laser light source 101 is shaped to a predetermined beam shape via a beam shaping optical system (not shown) of an illumination optical system 104, and inputted into an optical integrator (not shown). The optical integrator has a large number of secondary light sources to irradiate a mask 109, to be described later, with a uniform illumination distribution. The shape of opening aperture 105 of the illumination optical system 104 is an approximately circular shape, and the diameter of the opening, by extension, the aperture number (NA) of the illumination optical system, can be set to a desired value by an illumination system controller 108. In this case, the value of the ratio of the opening number of the illumination optical system to the opening number of a reduction projection lens 110 to be described later is a coherence factor (σ value), and the illumination system controller 108 controls the opening aperture 105 of the illumination system to thereby set the σ value. A half mirror 106 is provided on the optical path of the illumination optical system 104, and a part of exposure light to irradiate the mask 109 is reflected and extracted with the half mirror. A photo sensor 107 for ultraviolet light is provided on the optical path of the reflected light from the half mirror 106, to generate an output corresponding to the intensity of exposure light (exposure energy). The output from the photo sensor 107 is converted to exposure energy per one pulse by an integrating circuit (not shown) for integration by pulse light emission in the pulse laser light source 101, and inputted via the illumination system controller 108 into the main controller 103, which controls the overall exposure apparatus.

Figure 2:
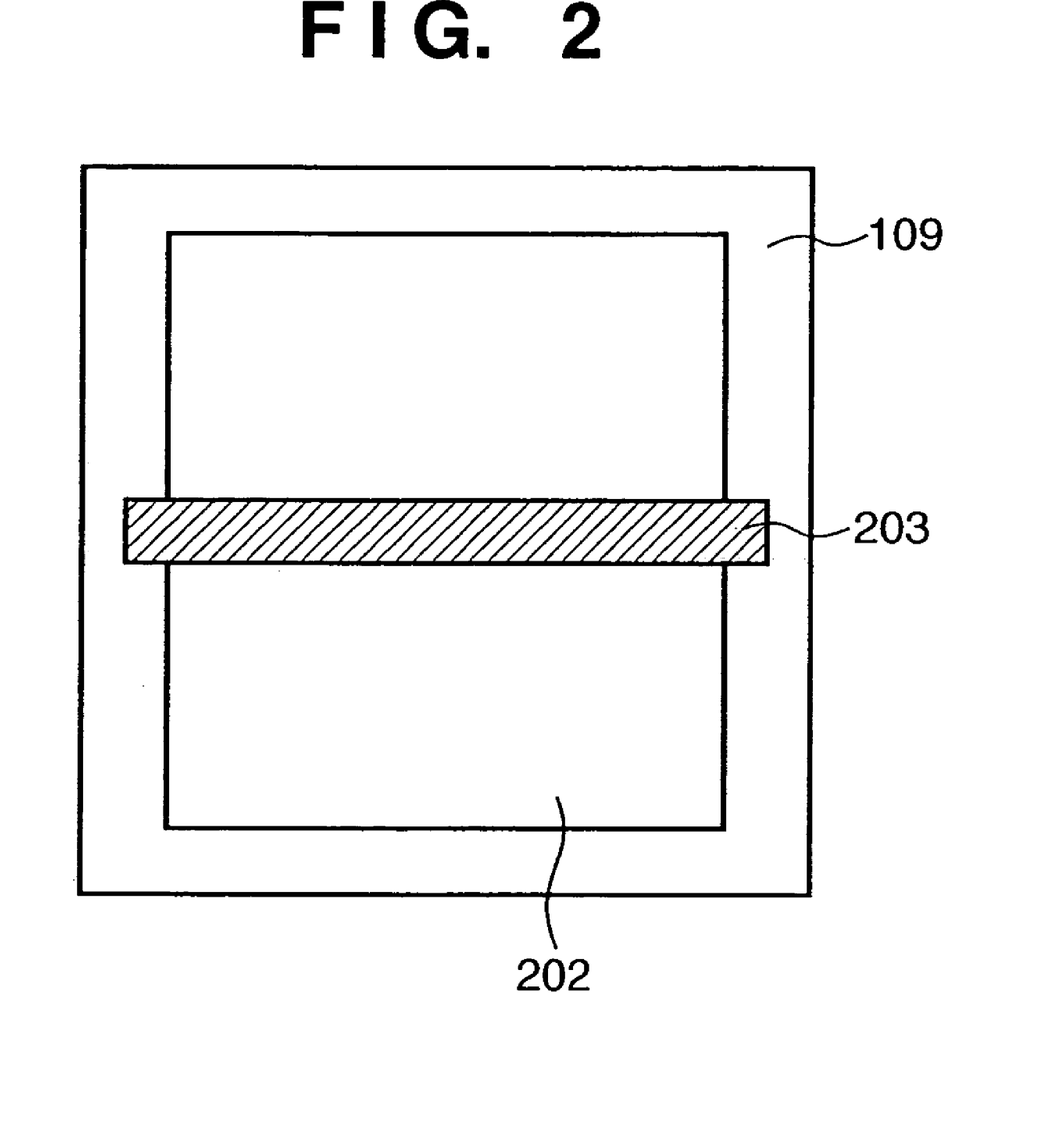
FIG. 2 is an explanatory view of exposure processing by the exposure apparatus in FIG. 1.

The reticle (or mask) 109 where a semiconductor device circuit pattern to be printed is formed, is irradiated with exposure light from the illumination optical system 104. As a variable blind (not shown), a light shielding plate is provided in a plane in an orthogonal direction to the optical axis, to arbitrarily set an irradiation area of the circuit pattern surface of the mask 109. FIG. 2 shows a status where the mask 109 is irradiated. A part of a circuit pattern 202 on the mask 109 is slit-irradiated with a slit light flux 203, and reduction-exposure of the part of the circuit pattern 202 is made on a wafer 115 coated with a photo resist at a reduction scale β (β is, e.g., ¼) with a projection lens 110 shown in FIG. 1. At this time, as in an arrow (Scan) in FIG. 1, multiple pulse exposure from the pulse laser light source 101 is repeated while the mask 109 and the wafer 115 are scanned in mutually opposite directions to the projection lens 110 and the slit light flux 203 at the same speed rate corresponding to the reduction scale β of the projection lens 110. In this manner, the entire circuit pattern 202 on the mask 109 is transferred to one or plural chip areas on the wafer 115.

An opening aperture 111 of the projection lens 110 having an approximately circular opening shape is provided on the pupil surface (Fourier transform surface to the reticle) of the projection lens 110. The diameter of the opening is controlled by a driving unit 112, such as a motor, thereby, a desired aperture value is set. Further, a field lens driving unit 113 moves a field forming a part of the lens system of the projection lens 110 in the optical axis direction of the projection lens by utilizing air pressure or a piezoelectric device, which excellently maintains the projection scale and distortion error while preventing degradation of various aberrations of the projection lens.

A wafer stage 116, which is movable in three-dimensional directions, moves in the optical axis direction (z direction) of the projection lens 110 and in a plane orthogonal to the direction (X-Y plane). A laser interferometer 118 measures the distance to a moving mirror 117 fixed on the wafer stage 116, thereby detecting the X-Y surface position of the wafer stage 116. A wafer stage controller 12 under the control of the main controller 103 of the exposure apparatus detects the position of the wafer stage 116 by the laser interferometer 118, and controls a driving unit 119 such as a motor, thereby moving the wafer stage 116 to a predetermined X-Y plane position.

In the present embodiment, a so-called step-and-scan method is employed. That is, when positioning of the mask 109 and the wafer 115 has been performed to set them in a predetermined relation, the laser controller 102, the wafer stage controller 120 and a mask stage controller 124 perform control for scan exposure to transfer the entire circuit pattern 202 on the mask 203 to the chip area(s) on the wafer 115, based on a synchronizing signal from the main controller 103. Thereafter, the wafer 115 is moved in the X-Y plane by a predetermined amount with the wafer stage 116, and similarly, projection exposure is sequentially performed on the other areas of the wafer 115.

Figure 3:
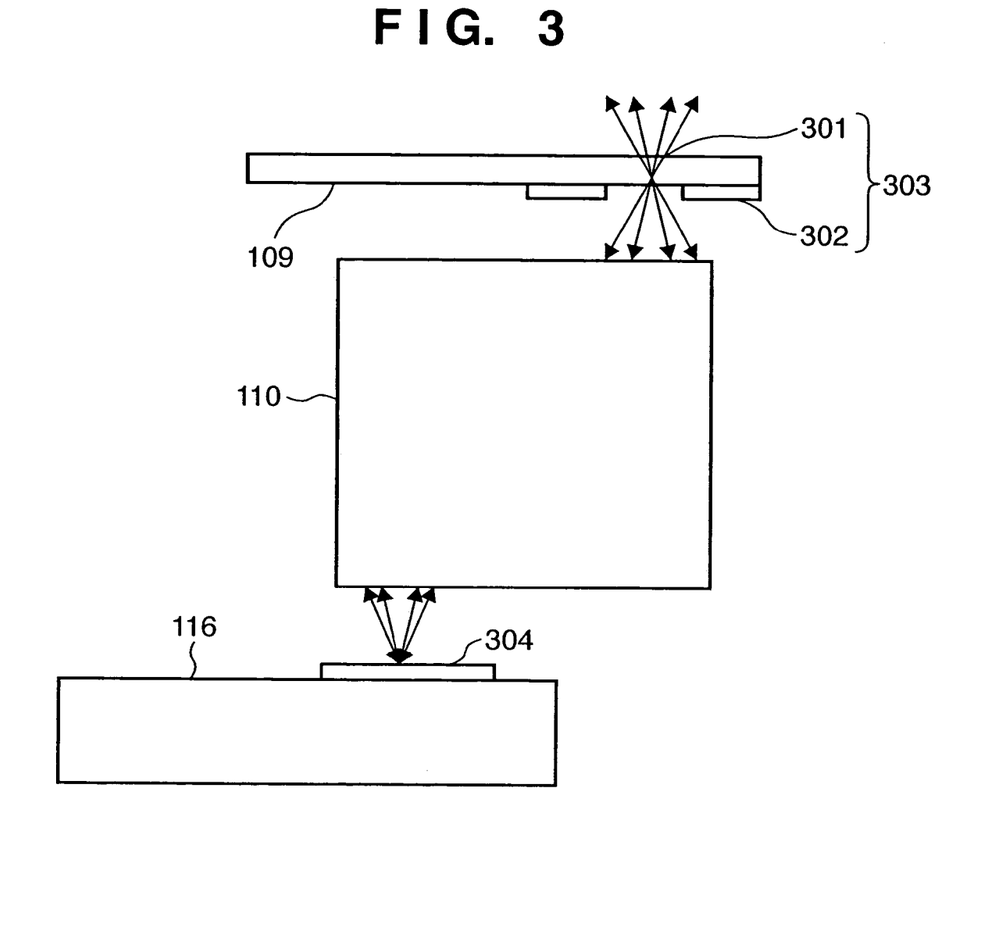
FIG. 3 is an explanatory view of reflected light when a reference reflecting mirror and an image surface of a projection lens are in correspondence with each other, in the exposure apparatus according to the first embodiment.
Figure 4:
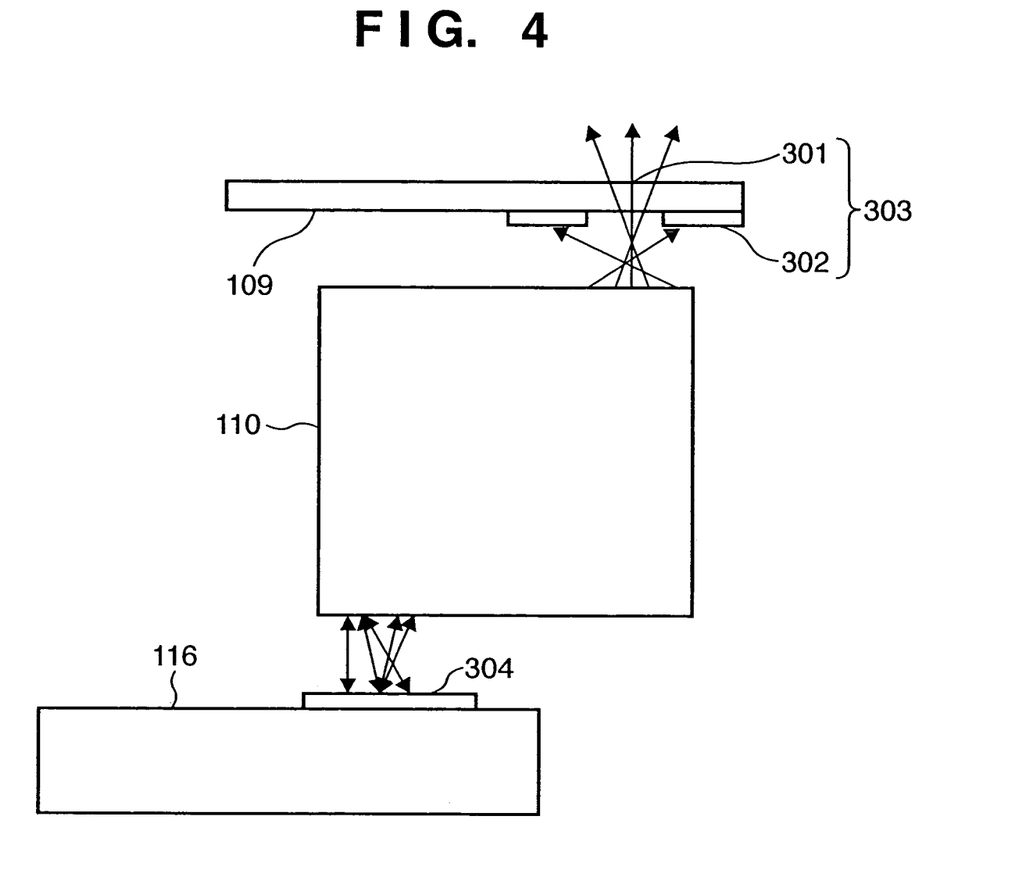
FIG. 4 is an explanatory view of reflected light when the reference reflecting mirror and the image surface of the projection lens are not in correspondence with each other, in the exposure apparatus according to the first embodiment.

Next, a so-called through-the-lens auto focus system (TTLAF) will be described with reference to FIGS. 3 and 4. The system detects a focus position change of the projection lens as an example of the correction parameters by detecting a focused point through the projection lens 110. In FIGS. 3 and 4, a focus mark 303 is formed with a light transmitting member 301 and a light shielding member 302 on the mask 109. First, FIG. 3 shows a status where a reference plane mirror 304 is in the focus position of the projection lens 110. Light passed through the light transmitting member 301 on the mask 109 is gathered via the projection lens 110 on the plane mirror 304 and reflected. The reflected light moves in the same optical path as that upon approach to the mirror, then is gathered via the projection lens 110 on the mask 109, and passes through the light transmitting member 301 on the mask 109. At this time, the measurement light is not eclipsed with the light shielding member 302, but all the light flux passes through the light transmitting member 301.

On the other hand, FIG. 4 shows a status where the reference plane mirror 304 is shifted from the focus position of the projection lens 110. The light passed through the light transmitting member 301 arrives at the reference plane mirror 304 via the projection lens 110. However, as the reference plane mirror 304 is not in the focus surface of the projection lens 110, the measurement light, as spreading light flux, is reflected by the reference plane mirror 304. The reflected light moves in an optical path different from that upon approach to the mirror, then passes through the projection lens 110, and arrives at the mask 109 as a light flux having a spread corresponding to the amount of shift of the reference plane mirror 304 from the focus surface of the projection lens 110, without being gathered on the mask 109. At this time, a part of the light flux is eclipsed with the light shielding member 302 on the mask 109, and all the light flux cannot pass through the light transmitting member 301. That is, the amount of reflected light through the mask 109 when the reference plane mirror 304 corresponds with the focus surface is different from that when the reference plane mirror 304 does not correspond with the focus surface.

To detect the focus position (image surface position) of the projection lens 110, the reference plane mirror 304 attached to the wafer stage 116 is moved to a position immediately below the projection lens 110 in advance. Next, the reference plane mirror 304 is step-driven in the optical axis direction of the projection lens 110, then the reference plane mirror 304 is irradiated and reflected light is measured by a TTLAF system (not shown). Thus, a reflected light amount profile is obtained by repeating the step driving and measurement of reflected light, and the focus position (image surface position) is detected.

Next, management of the correction parameter, in the exposure apparatus having the above construction, will be described below.

Figure 6A:
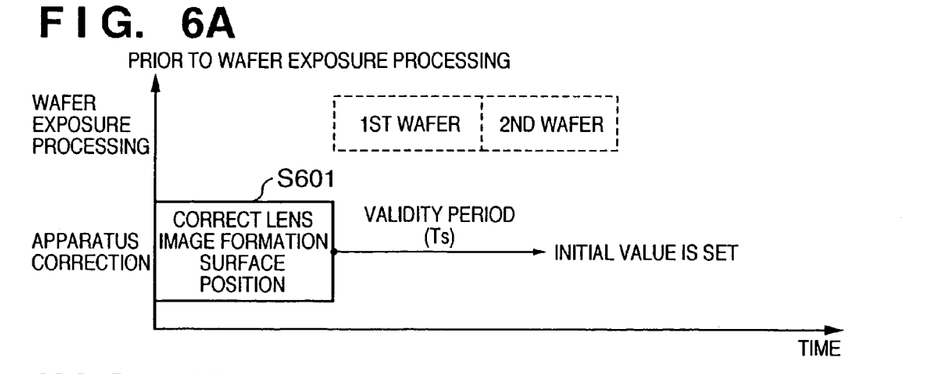
FIGS. 6A to 6C are timing charts showing an apparatus correction operation according to the first embodiment.
Figure 6B:
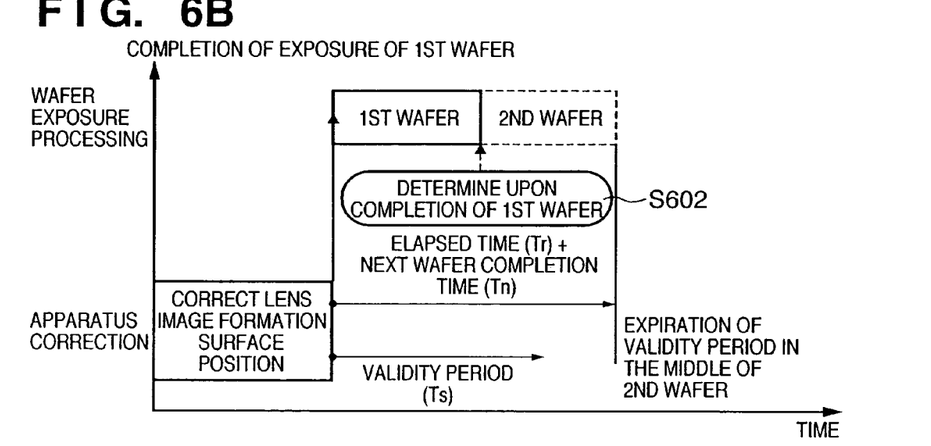
Figure 6C:
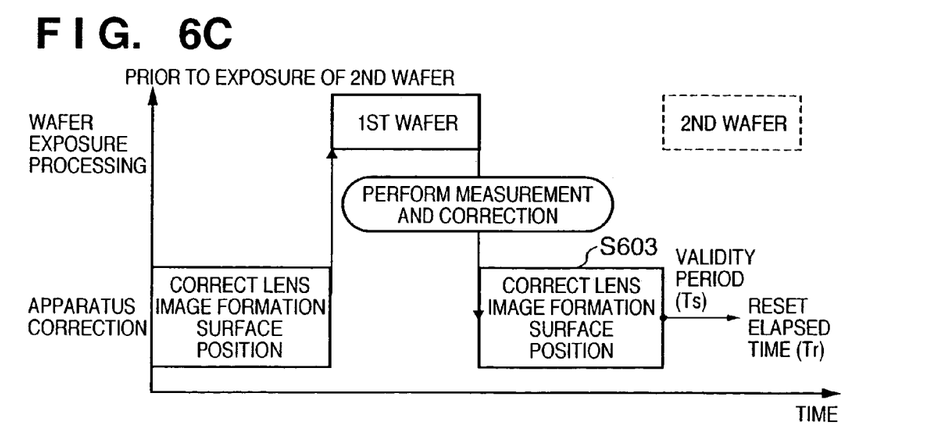

First, a particular control method for automatically planning timing of measurement and correction of a correction parameter will be described with reference to the timing charts of FIGS. 6A to 6C and the flowchart of FIG. 9. FIGS. 6A to 6C schematically show the sequence of wafer exposure processing and apparatus correction. In the apparatus correction in the present embodiment, the above-described focus position (hereinbelow, image surface correction value) of the projection lens is measured as a correction parameter.

Figure 9:
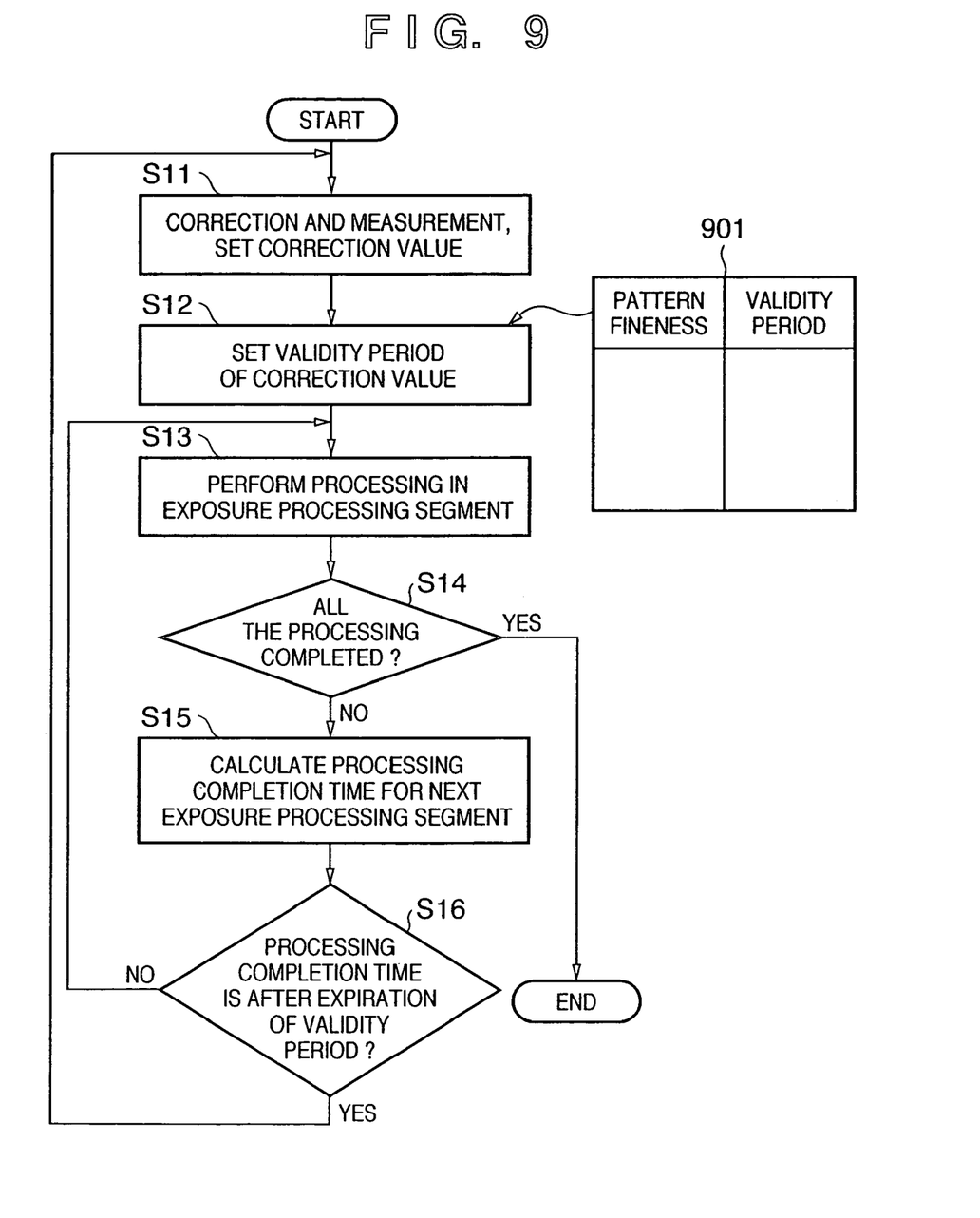
FIG. 9 is a flowchart showing the apparatus correction operation according to the first embodiment.

When production by the exposure apparatus is started, measurement of the image surface correction value is performed prior to wafer exposure processing (step S11 in FIG. 9 and step S601 in FIG. 6A). A fluctuation amount from an optimum value (designed value) is obtained as an image surface correction parameter, and the field lens driving unit 113 and the wafer stage control unit 119 as constituent elements (units) are correction-controlled based on the parameter. After the correction control, a validity period (Ts) is set for the image surface correction parameter, and measurement of an elapsed time (Tr) from the image surface correction is started (step S12). Note that the validity period (Ts) is a parameter representing a period where correction using the measured correction value is possible (e.g., a period wherein a time change of the fluctuation amount is within an allowable range). The validity period (Ts) differs in accordance with fineness (processing accuracy) of a semiconductor device circuit pattern. In the present embodiment, the time change amount of the correction value is experimentally obtained in advance, circuit pattern fineness is classified into several levels, and allowable periods are registered in a table (901 in FIG. 9). The exposure apparatus can recognize information on fineness based on recipe information previously inputted in the exposure apparatus or individual information inputted by an operator. Note that in FIGS. 6A to 6C, the validity period of the image surface correction corresponds to a time for exposure processing for 1.5 substrates (wafers).

The step-and-scan wafer exposure processing is repeated as wafer exposure of the first wafer (step S13). When the wafer exposure processing has been completed, it is determined whether or not the next wafer is to be processed (step S14). If the next wafer is to be processed, the process proceeds to step S15. At step S15, the next exposure processing segment, i.e., a period (time) for the completion of exposure of the second wafer is prediction-calculated (S602 in FIG. 6B). The time of completion of exposure of the next wafer is expressed as follows.

[next wafer completion time]=[elapsed time($Tr$)]+ [predicted next wafer processing time($Tn$)]  (Expression 1)

In the present embodiment, it may be arranged such that an (Expression 2) where "predicted next wafer processing time (Tn)" in the (Expression 1) is replaced with "first wafer processing time (Tr)" is employed, thereby prediction accuracy can be increased.

[next wafer completion time]=[elapsed time($Tr$)]×$n$  (Expression 2)

Note that in the (Expression 2), "n" indicates that the next wafer is the n-th wafer.

At step S16, it is determined whether or not processing completion time in the next exposure processing segment is prior to expiration of the currently-set validity period of the correction parameter (within the validity period). If the processing completion time in the next exposure processing segment is within the validity period, the process returns to step S13, to perform processing in the next exposure processing segment. On the other hand, if the processing completion time in the next exposure processing segment is not within the validity period, the process returns to step S11, to again perform correction value measurement and correction value setting. In the case of FIG. 6B, if the next wafer completion time does not exceed the validity period (Ts), exposure processing of the second wafer is performed. Thereafter, every time exposure of one wafer has been completed, it is determined whether or not the next wafer completion time is prior to the expiration of the validity period, and timing, at which measurement of a correction parameter is required again, is monitored. If the next wafer completion time exceeds the validity period, it is determined that the validity period expires in the middle of exposure of the next wafer. Then, apparatus correction is performed prior to a start of the next wafer exposure processing (step S603 in FIG. 6C). At step S603, as in the case of step S601, the image surface correction value is measured and the constituent elements (units) are correction-controlled, and using this time point as a reference time point, measurement of an elapsed time (Tr) is started again.

As described above, in the exposure apparatus of the first embodiment, a validity period is set in correspondence with a processing accuracy of a device circuit pattern, and the next correction timing is determined based on the validity period. Note that in FIGS. 6A to 6C, exposure of one wafer is used as the exposure processing segment in FIG. 9, i.e., whether correction is necessary or not is determined by exposure of one wafer. However, the exposure processing segment may be exposure of N (N≧2) wafers, or exposure for one chip or exposure for one shot.

Second Embodiment

In the second embodiment, an operation upon stoppage of exposure processing in the exposure processing segment (step S13) in the above-described first embodiment will be described. In the second embodiment, upon occurrence of such stoppage, it is determined whether or not the validity period of the correction value expires if the remaining exposure processing is performed, and the measurement of the correction value is performed again in accordance with necessity.

Figure 7A:
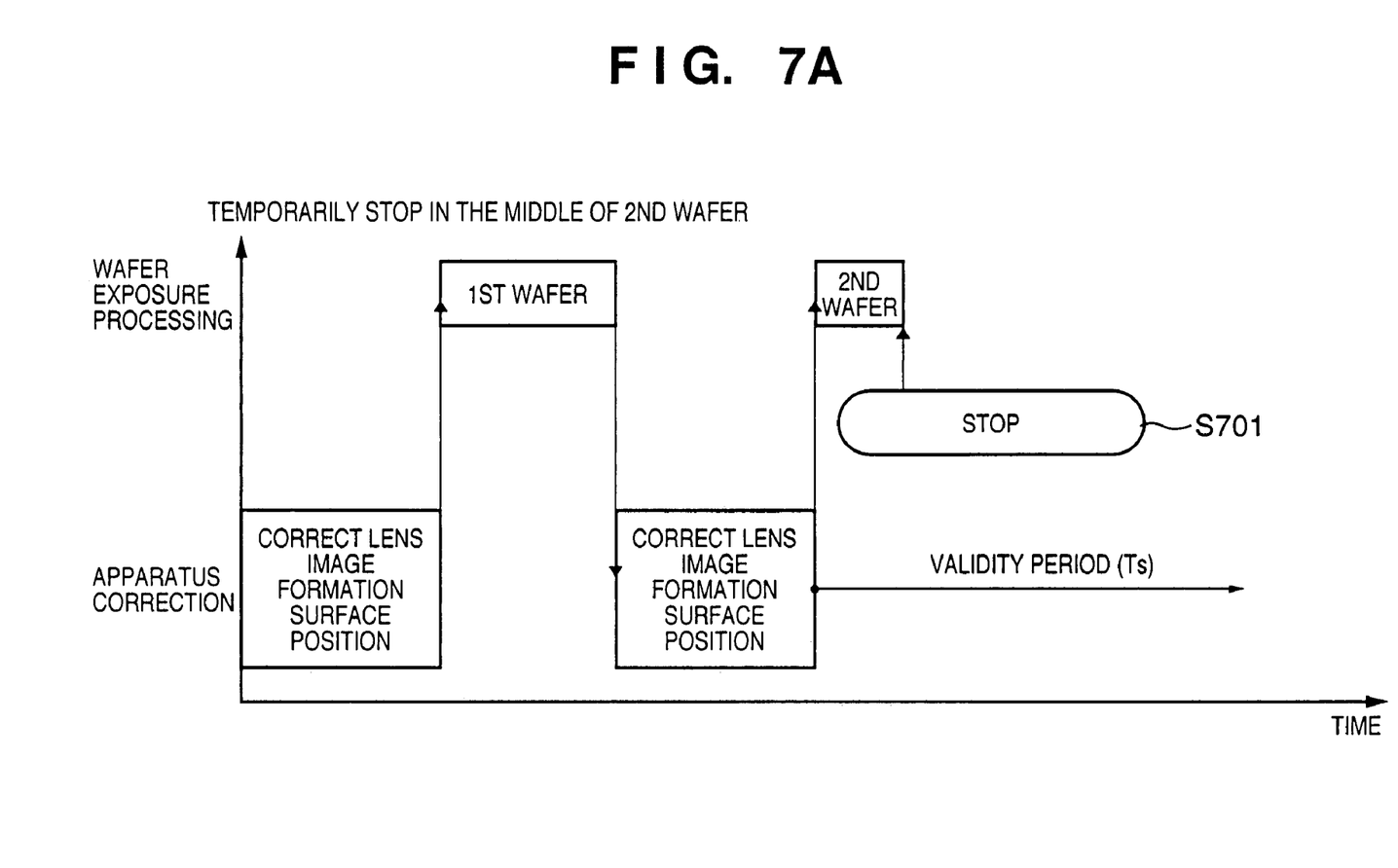
FIGS. 7A to 7C are timing charts showing the apparatus correction operation according to a second embodiment of the present invention.
Figure 7B:
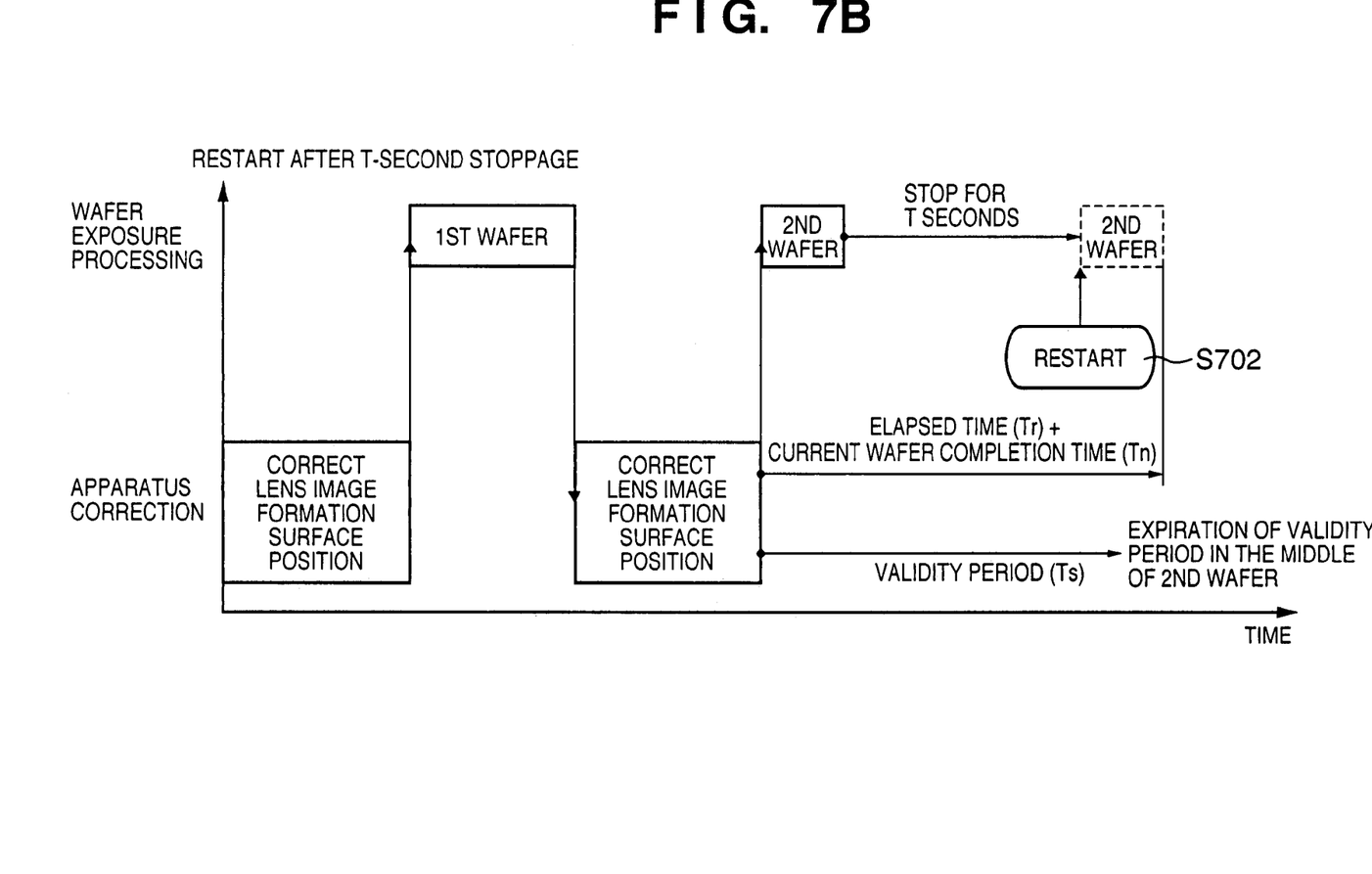
Figure 7C:
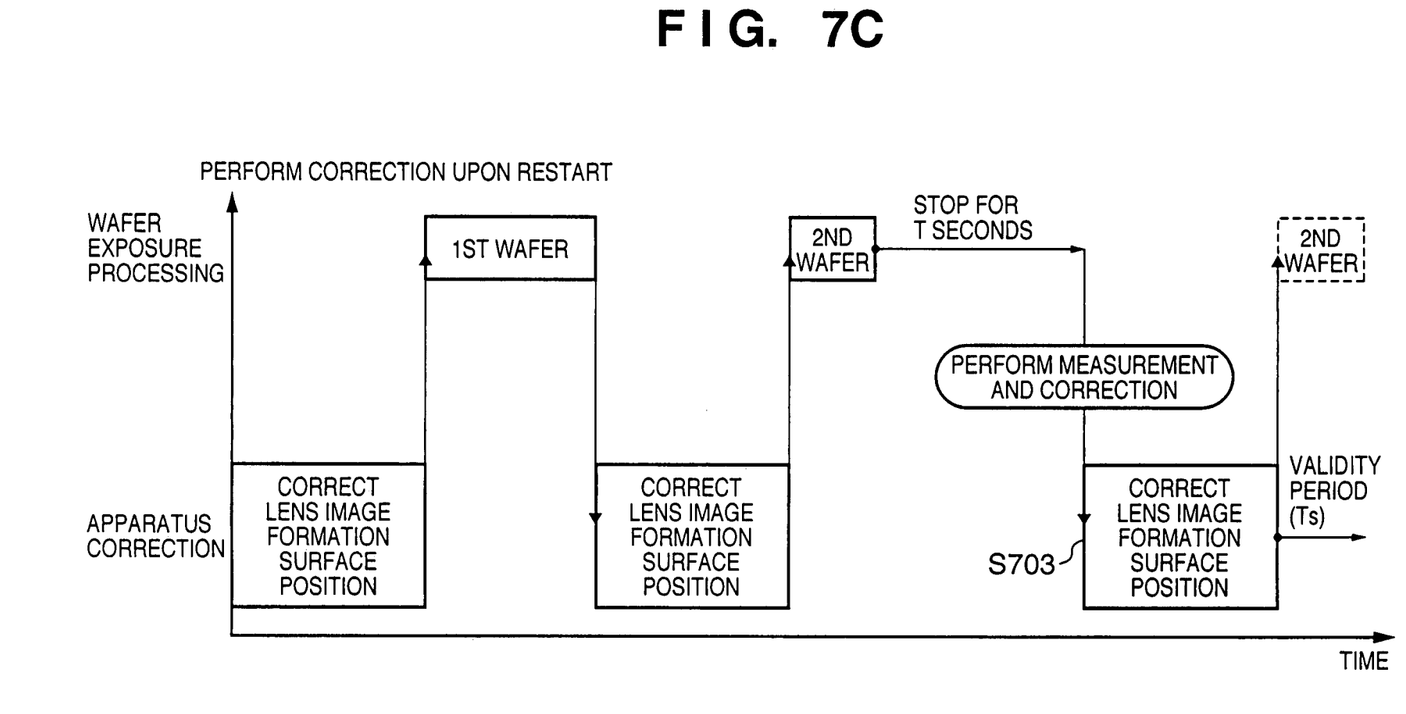
Figure 10:
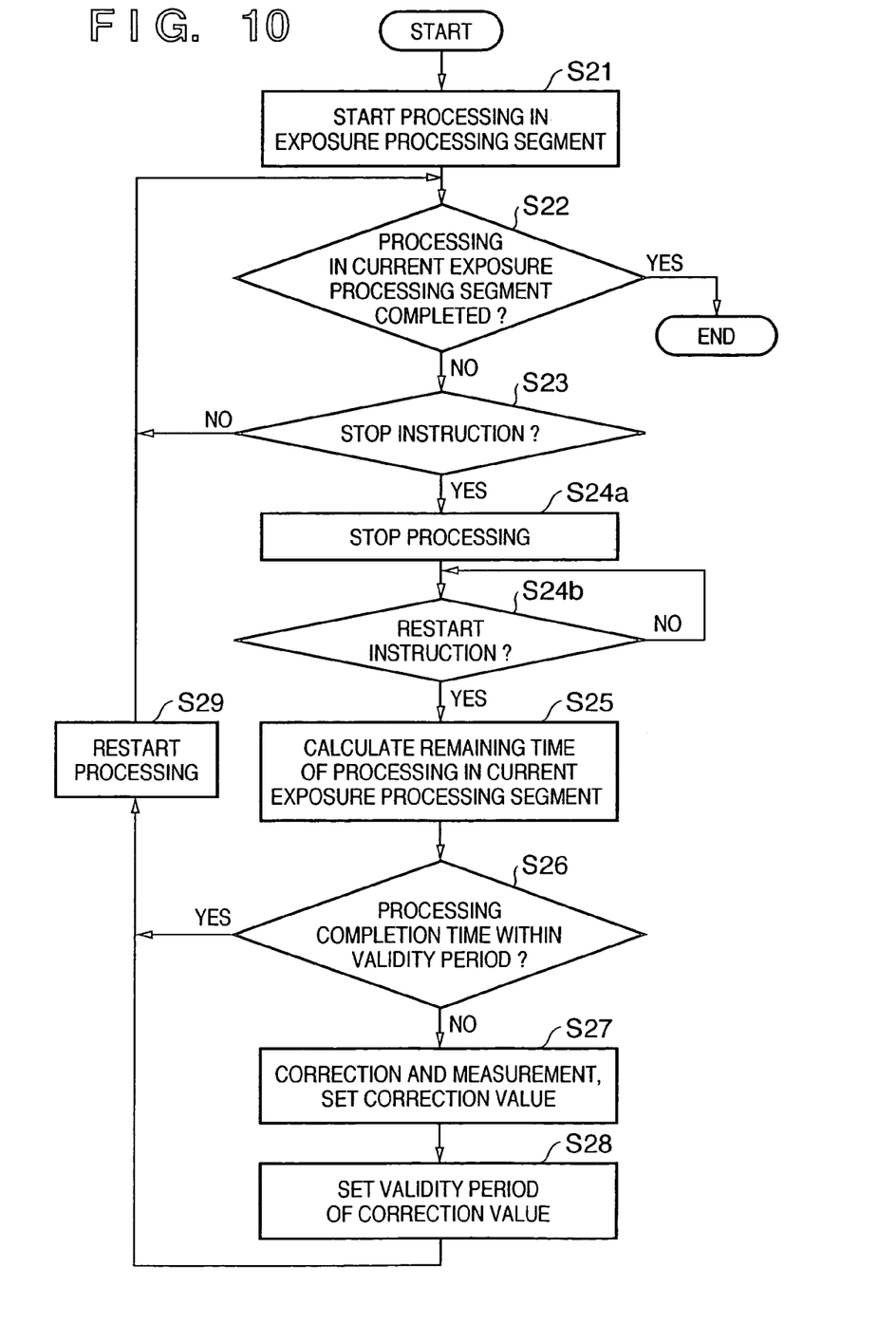
FIG. 10 is a flowchart showing the apparatus correction operation according to the second embodiment.

FIGS. 7A to 7C are timing charts showing an apparatus correction operation after temporary stoppage of exposure processing, according to the second embodiment. FIG. 10 is a flowchart showing the apparatus correction operation according to the second embodiment. When the processing at step S13 in FIG. 9 has been started, first, the processing in the exposure processing segment is started at step S21. Then, if it is determined at step S22 that the processing in the exposure processing segment has been completed, the processing at step S13 ends. If it is determined at step S22 that the exposure processing has not been completed, the process proceeds to step S23, at which it is determined whether or not a stop instruction has been inputted. If a stop instruction has not been inputted, the above steps S22 and S23 are repeated. Then, when a stop instruction is inputted during exposure processing, the exposure processing is stopped at step S24a, and it is determined at step S24b whether or not an instruction to restart the exposure processing has been inputted. The stopped status is maintained until restart is instructed.

When a restart instruction has been inputted, the process proceeds to step S25, at which the remaining time for the exposure processing to the exposure processing segment is calculated, thereby, the predicted processing completion time is calculated. At step S26, it is determined whether or not the predicted processing completion time is prior to expiration of the validity period. If the predicted processing completion time is prior to the validity period, the processing is restarted, and the process returns to step S22. On the other hand, if the predicted processing completion time exceeds the validity period, the process proceeds to step S27, to again perform correction value measurement and correction value setting. At step S28, the validity period of the correction value is newly set. Note that if the validity period set at step S12, is available, it may be used. Then, at step S29, the processing is restarted, and the process returns to step S22.

FIG. 7A shows a status wherein the apparatus has been stopped in the middle of exposure of the second wafer (S701) after the image surface correction in FIG. 6C. FIG. 7B shows a status wherein the exposure apparatus has been restarted after t seconds. The time of completion of the second wafer upon restart of the processing is prediction-calculated as follows.

[current wafer completion time]=[elapsed time($Tr$)]+ [remaining processing time($Tn$) for 2nd (being processed)wafer]     (Expression 3)

The (Expression 3) may be replaced with an (Expression 4) using the first wafer processing time ($Tr[1]$) and measured stoppage time (t), thereby, the accuracy of prediction of current wafer completion time can be increased by reflecting a measured value.

[current wafer completion time]=[first wafer processing time($Tr[1]$)]×n+[stoppage time($t$)]     (4)

Note that n indicates that the current wafer is the n-th wafer.

If the current wafer completion time does not exceed the validity period (Ts), the exposure processing is restarted in the middle of the second wafer. If the current wafer completion time exceeds the validity period (Ts), the apparatus correction is performed as shown in FIG. 7C (S703, S27 and S28). After the execution of the apparatus correction, the exposure processing is restarted in the middle of the second wafer.

Third Embodiment

In the first and second embodiments, the validity period is set at step S12 and step S28 by referring to a table where validity periods are registered, based on information on circuit pattern fineness. In the third embodiment, the validity period of the correction parameter is dynamically adjusted. The correction parameter is automatically measured and corrected while an elapsed time is compared with the validity period, as in the case of FIGS. 6A to 6C and FIGS. 7A to 7C in the first and second embodiments. The difference is that the validity period for the next correction is determined by calculation based on a predicted correction amount and a measured correction amount. That is, correction time (validity period) appropriate to an apparatus status can be planned (determined) by not using the experimentally obtained validity period, but feeding back (reflecting) a correction amount measured during production to the determination of a validity period for the next correction time.

Figure 8A:
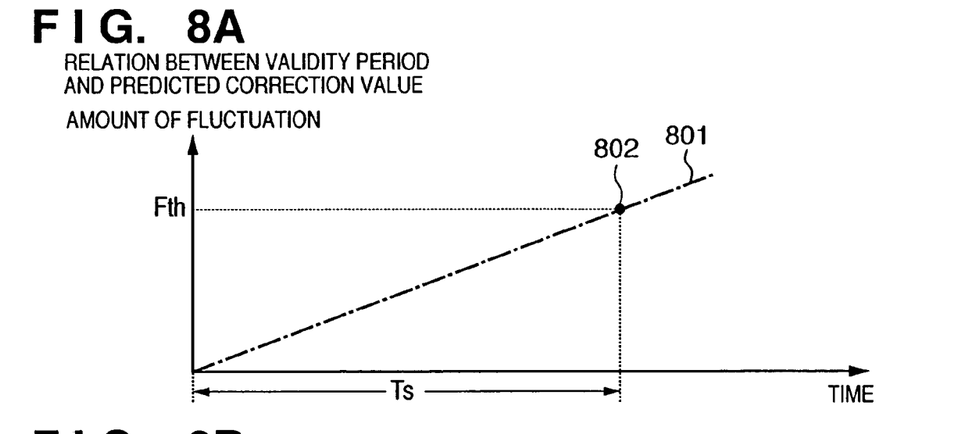
FIGS. 8A to 8C are timing charts showing setting of a correction value validity period according to a third embodiment of the present invention.

Next, an example of feedback of a measured correction amount to the next validity period will be described with reference to FIGS. 8A to 8C. FIG. 8A shows a straight line 801 as a time change characteristic of an experimentally obtained correction value. In this example, a correction value (fluctuation amount) is modeled as a linear function of elapsed time. Assuming that a fluctuation amount Fth is an allowable limit, the elapsed time Ts to an intersection point 802 between the characteristic line 801 and the fluctuation allowable value Fth is registered as a validity period.

Figure 8B:
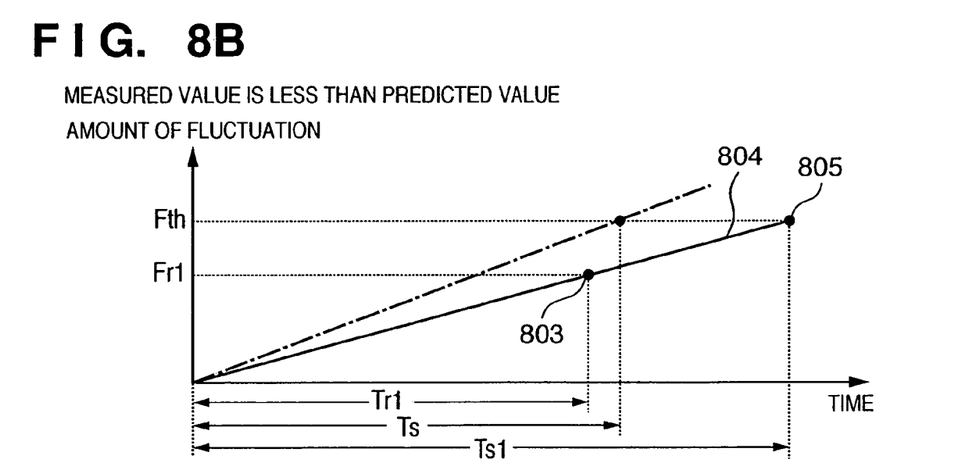

FIG. 8B shows an example wherein a correction value measured during production is less than a predicted value. When the correction amount measured at a point of time Tr1 within the validity period Ts is Fr1, a straight line 804 passing through a point 803 represents a characteristic of a current apparatus status. Time Ts1, obtained by substitution of the limit fluctuation amount Fth into the straight line 804, is set as a new validity period. If the measured correction value is less than the predicted correction value, the next validity period is extended by "Ts1−Ts".

Figure 8C:
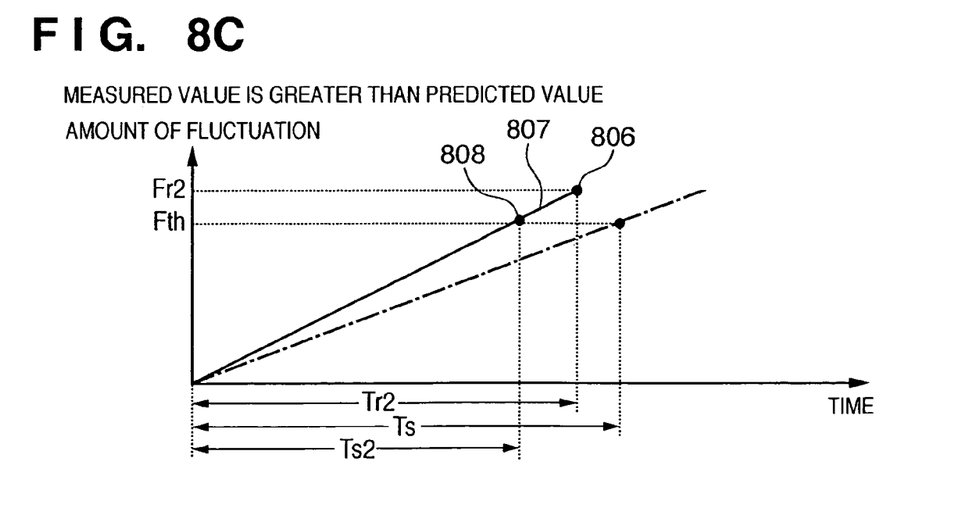

Next, FIG. 8C shows an example wherein a correction value measured during production is greater than a predicted value, in contradiction to the example in FIG. 8B. In this case, when a correction amount measured at a point of time Tr2 within the validity period Ts is Fr2, a straight line 806 passing through a point 806 is approximated, and time Ts2, obtained by substitution of the limit fluctuation amount Fth into the straight line, is set as a new validity period. If the measured correction value is greater than the predicted correction value, the next validity period is shortened by "Ts−Ts2".

In FIGS. 8A to 8C, the time change of the correction value is predicted as a linear function. However, it is desirable that correction parameters based on, e.g., exposure heat as a dominant factor are predicted as exponential functions. Formulation in such a case can be easily made.

In the first to third embodiments, the correction planning method in a projection exposure apparatus has been described. In these embodiments, descriptions have been made regarding one (one type of) correction parameter, however, the method can be applied to a predetermined parameter group unit or one parameter unit.

Further, in a case wherein the validity periods are registered in several levels corresponding to circuit pattern fineness, if a parameter regarding circuit pattern fineness is set in a recipe (operation parameters) generated by the operator, the validity period of the correction parameter can be automatically set based on this parameter.

According to the above embodiments, even for a large number of correction parameters, it is not necessary for the operator to set a validity period for each of the parameters, and excellent apparatus operability and productivity can be obtained. Further, even in a case wherein correction must be repeated in a comparatively short period for requirement of high accuracy, the correction can be performed at an appropriate correction timing based on an apparatus status. Accordingly, unnecessary degradation of productivity in exposure processing can be suppressed while a necessary exposure accuracy can be maintained.

Figure 11:
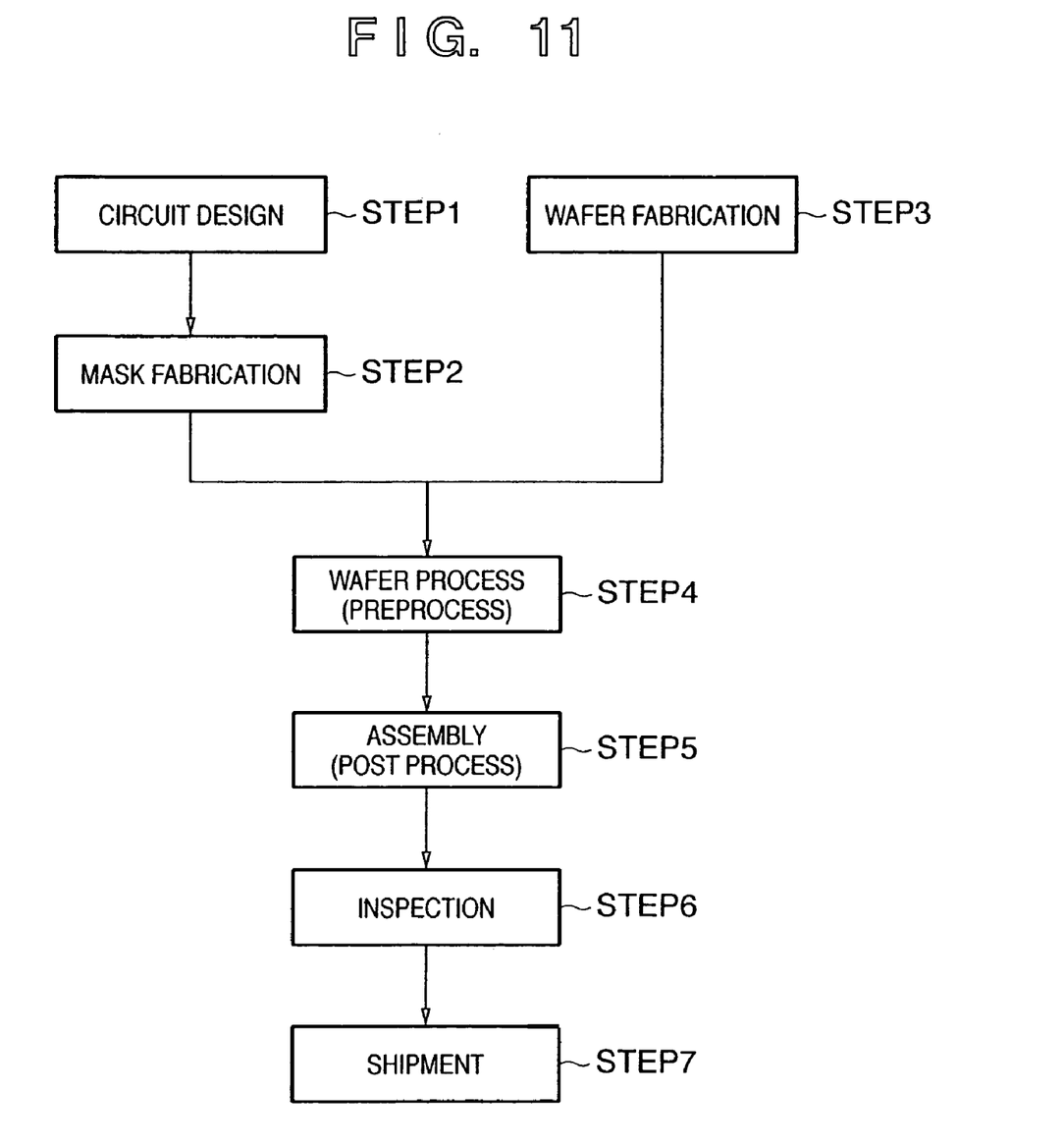
FIG. 11 is a flowchart showing the flow of an entire semiconductor device fabrication process.

Next, a semiconductor device fabrication process will be described as an example of fabrication of a micro device, or the like, by utilizing the above-described exposure apparatus. FIG. 11 is a flowchart showing the flow of an entire semiconductor device fabrication process. At step 1 (circuit designing), a semiconductor device circuit pattern is designed. At step 2 (mask fabrication), a mask is fabricated based on the designed pattern.

On the other hand, at step 3 (wafer fabrication), a wafer is fabricated by using a material such as silicon. At step 4 (wafer process), called a preprocess, an actual circuit is formed on the wafer by a lithography technique using the above mask and wafer. At the next step 5 (assembly), called a post process, a semiconductor chip is fabricated by using the wafer carrying the circuit formed at step 4. Step 5 includes an assembly process (dicing and bonding), a packaging process (chip encapsulation), and the like. At step 6 (inspection), inspections such as an operation check, a durability test, and the like, are performed on the semiconductor device formed at step 5. The semiconductor device is completed through these processes, and is shipped (step 7).

The wafer process at the above step S4 has an oxidation step of oxidizing the surface of the wafer, a CVD step of forming an insulating film on the surface of the wafer, an electrode formation step of forming electrodes by vapor deposition on the wafer, an ion implantation step of injecting ions in the wafer, a resist processing step of coating the wafer with a photo resist, an exposure step of exposure-printing the circuit pattern on the wafer by the above-described exposure apparatus, a development step of developing the exposed wafer, an etching step of removing other portions than the developed resist, and a resist stripping step of removing the resist, which is unnecessary after the completion of etching. These steps are repeated, to form multiple layers of circuit patterns on the wafer.

According to the present invention as described above, unnecessary degradation of productivity in exposure processing can be suppressed while necessary exposure accuracy can be maintained.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2003-364955 filed on Oct. 24, 2003, the entire contents of which are incorporated by reference herein.

What is claimed is:

1. An exposure apparatus for exposing a subject to a pattern, said apparatus comprising:
   an update system to update a parameter necessary for processing in said exposure apparatus through measurement;
   a setting system to set a validity period of the parameter updated by said update system; and
   a control system to cause said update system to perform an update based on the validity period, wherein, prior to execution of a unit of the processing, said control system determines whether the update by said update system is to be performed, based on a predicted completion time of the unit and the validity period, and, if processing in the unit is interrupted and then restarted, said control system determines whether the update by said update system is to be performed, based on a predicted completion time of remaining processing in the unit.

2. An exposure apparatus according to claim 1, wherein said setting system sets the validity period of the parameter based on information which associates an accuracy required for the processing with the validity period, and information on the accuracy.

3. An exposure apparatus according to claim 1, wherein said setting system sets the validity period of the parameter based on a change amount and an update time of the parameter updated by said update system.

4. An exposure apparatus according to claim 1, wherein plural parameters are to be updated by said update system.

5. An exposure apparatus according to claim 1, further comprising a projection optical system for projecting a pattern of a mask to the substrate, wherein the parameter corresponds to a position of an image surface of said projection optical system.

6. A device manufacturing method comprising steps of:
exposing a substrate to a pattern using an exposure apparatus as recited in claim 1; and
developing the exposed substrate.

7. A control method for an exposure apparatus for exposing a substrate to a pattern, said method comprising steps of:
updating a parameter necessary for processing in the exposure apparatus through measurement;
setting a validity period of the parameter updated in said updating step; and
controlling an execution of said updating step based on the validity period, wherein, prior to execution of a unit of the processing, said controlling step determines whether the update in said updating step is to be performed, based on a predicted completion time of the unit and the validity period, and, if processing in the unit is interrupted and then restarted, said controlling step determines whether the update in said updating step is to be performed, based on a predicted completion time of remaining processing in the unit.

8. A control method according to claim 7, wherein, in said setting step, the validity period of the parameter is set based on information which associates an accuracy required for the processing with the validity period, and information on the accuracy.

9. A control method according to claim 7, wherein, in said setting step, the validity period of the parameter is set based on a change amount and an update time of the parameter updated in said updating step.

10. A control method according to claim 7, wherein plural parameters are to be updated in said updating step.

11. A control method according to claim 7, further comprising projecting, using a projection optical system, a pattern of a mask to the substrate, wherein the parameter corresponds to a position of an image surface of the projection optical system.

* * * * *